(12) United States Patent
Boillot

(10) Patent No.: US 8,793,621 B2
(45) Date of Patent: Jul. 29, 2014

(54) METHOD AND DEVICE TO CONTROL TOUCHLESS RECOGNITION

(75) Inventor: Marc Andre Boillot, Plantation, FL (US)

(73) Assignee: NaviSense, Plantation, FL (US)

( * ) Notice: Subject to any disclaimer, the term of this patent is extended or adjusted under 35 U.S.C. 154(b) by 1410 days.

(21) Appl. No.: 11/936,778

(22) Filed: Nov. 7, 2007

(65) Prior Publication Data

US 2008/0111710 A1   May 15, 2008

Related U.S. Application Data

(60) Provisional application No. 60/865,167, filed on Nov. 9, 2006, provisional application No. 60/865,166, filed on Nov. 9, 2006.

(51) Int. Cl.
*G06F 3/033* (2013.01)

(52) U.S. Cl.
USPC .......................................................... 715/863

(58) Field of Classification Search
CPC ............................... G06F 3/048; G06F 3/0346
USPC .......................................................... 715/863
See application file for complete search history.

(56) References Cited

U.S. PATENT DOCUMENTS

| | | | |
|---|---|---|---|
| 5,274,363 A | 12/1993 | Koved | |
| 6,111,580 A * | 8/2000 | Kazama et al. | 715/863 |
| 6,130,663 A | 10/2000 | Null | |
| 6,137,427 A | 10/2000 | Binstead | |
| 6,313,825 B1 | 11/2001 | Gilbert | |
| 6,937,227 B2 | 8/2005 | Qamhiyah | |
| 7,078,911 B2 | 7/2006 | Cehelnik | |
| 7,081,884 B2 | 7/2006 | Kong | |
| 7,092,109 B2 | 8/2006 | Satoh | |
| 7,130,754 B2 | 10/2006 | Satoh | |
| 2003/0132913 A1 | 7/2003 | Issinski | |
| 2003/0156756 A1 * | 8/2003 | Gokturk et al. | 382/190 |
| 2004/0178995 A1 * | 9/2004 | Sterling | 345/173 |
| 2004/0239622 A1 * | 12/2004 | Proctor et al. | 345/156 |
| 2005/0166163 A1 * | 7/2005 | Chang et al. | 715/863 |
| 2005/0210417 A1 * | 9/2005 | Marvit et al. | 715/863 |
| 2006/0010400 A1 * | 1/2006 | Dehlin et al. | 715/856 |
| 2006/0161871 A1 * | 7/2006 | Hotelling et al. | 715/863 |
| 2006/0164241 A1 | 7/2006 | Makela | |
| 2006/0224429 A1 | 10/2006 | Mathew | |
| 2006/0228149 A1 * | 10/2006 | Harley | 400/486 |
| 2006/0256090 A1 | 11/2006 | Huppi | |
| 2007/0127039 A1 | 6/2007 | Njolstad | |

\* cited by examiner

*Primary Examiner* — Boris Pesin
*Assistant Examiner* — Angie Badawi

(57) ABSTRACT

A sensor device (100) and method (300) for touchless finger signing and recognition is provided. The method can include detecting (304) a first pause of a finger in a touchless sensory space (101), tracking (306) a movement (140) of the finger, detecting (308) a second pause of the finger, creating (310) a trace (145) of the finger movement from the tracking, and recognizing (312) a pattern (146) from the trace. The pattern can be an alphanumeric character or a finger gesture. A user can accept or reject the recognized pattern via touchless finger control.

17 Claims, 18 Drawing Sheets

DETECT FIRST AND SECOND LOCATION

POSITIONAL TRACES

DETECT RETURN MOVEMENT

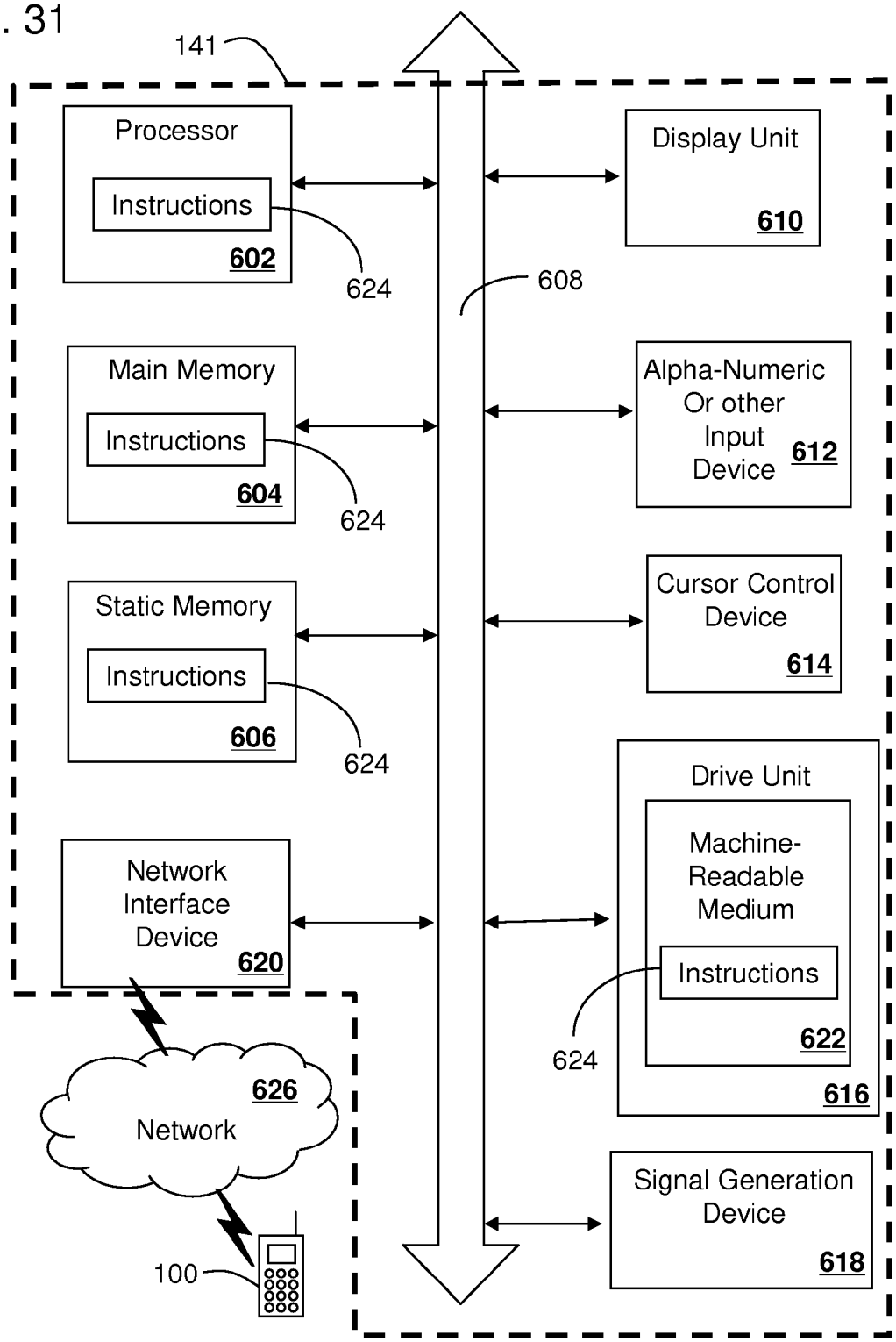

METHOD AND DEVICE TO CONTROL TOUCHLESS RECOGNITION

CROSS-REFERENCE TO RELATED APPLICATION

This application claims the priority benefit of U.S. Provisional Patent Application No. 60/865,167 entitled "Method and Device to Control Touchless Recognition" filed Nov. 9, 2006, the entire contents of which are hereby incorporated by reference. This application also claims the priority benefit of U.S. Provisional Patent Application No. 60/865,166 filed Nov. 9, 2006.

FIELD

The present embodiments generally relate to the field of user interfaces, and more particularly to signing and recognition using a user interface.

BACKGROUND

Mobile communication devices such as cell phones generally include a keypad and display for allowing a user to interact with mobile device applications. A user can navigate through menus presented on the display of the mobile device by pressing one or more keys on a keypad. Some keypads include a navigation pad which allows a user to navigate menus on the keypad. Mobile devices, such as cell phones or portable music players, are generally limited in size, and thus have small keypads. The small size of the keypad can limit the ease at which users can type on the small keypad, or navigate menus on the display via a keypad, to interact with the mobile device. Such keypads have keys with a touching area that is generally smaller than the size of a user's fingertip. The keypad and the navigation pads are touch-based which require physical user interaction.

SUMMARY

One embodiment is directed to a method and device for touchless character recognition. The method can include detecting a first pause of a finger in a touchless sensory space, tracking a movement of the finger in the touchless sensory space after the first pause, detecting a second pause of the finger in the touchless sensory space, creating a trace of the finger movement between the first pause and the second pause from the tracking, and recognizing a pattern from the trace. The pattern can be an alphanumeric character or a finger gesture. The pattern can be accepted upon continuing the second pause, performing a touchless finger confirm action, or issuing a voice command. Further, the method can include performing continuous pattern recognition of finger movements based on a return of the finger to a center location in the touchless sensory space. In such regard, the finger does not need to be paused at the first location and the second location.

A second embodiment is directed to a method for touchless finger gesturing. The method can include detecting a finger at a first location in a touchless sensory space, tracking a movement of the finger in the touchless sensory space, detecting a pause of the finger at a second location in the touchless sensory space, creating a trace of the finger movement between the first location and the second location from the tracking, and recognizing a pattern from the trace. The pattern can be accepted upon detection of a return movement of the finger from the second location to the first location. The pattern can be rejected upon detection of a continued finger pause at the second location. The pattern can also be determined from the trace based on acceleration vectors of the finger movement to a center location of the touchless sensory space.

A third embodiment is directed to a mobile device that provides touchless finger signing. The mobile device can include a sensor device for tracking a movement of a finger in a touchless sensing space, and a recognition engine for identifying at least one pattern in the movement, wherein the pattern is an alphanumeric character, letter, or symbol. The mobile device can include a controller for creating a trace from the movement. The trace can be a differential trajectory that incorporates spatial and temporal information of the finger movement. The recognition engine can include a neural network to process the trace and classify the at least one pattern as an alphanumeric character or a finger gesture.

BRIEF DESCRIPTION OF THE DRAWINGS

The features of the embodiments of the invention, which are believed to be novel, are set forth with particularity in the appended claims. Embodiments of the invention, together with further objects and advantages thereof, may best be understood by reference to the following description, taken in conjunction with the accompanying drawings, in the several figures of which like reference numerals identify like elements, and in which:

FIG. 7 is a depiction for recognizing a finger sign in accordance with an embodiment of the inventive arrangements;

FIG. 31 is a diagrammatic representation of a machine in the form of a computer system within which a set of instructions, when executed, may cause the machine to perform any one or more of the methodologies discussed herein.

DETAILED DESCRIPTION

Figure 1:
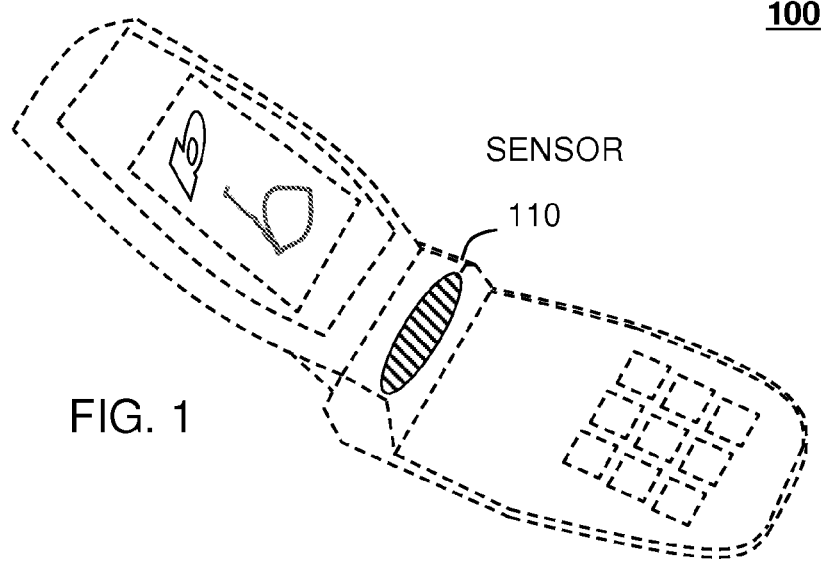
FIG. 1 is a mobile device for recognizing touchless finger movements and gestures in accordance with an embodiment of the inventive arrangements.

While the specification concludes with claims defining the features of the invention that are regarded as novel, it is believed that the invention will be better understood from a consideration of the following description in conjunction with the drawing figures, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The term "space" can be defined as exhibiting a two or three-dimensional aspect. The term "sensory space" can be defined as a two or three-dimensional volume. The term "field" can be defined as exhibiting a two-dimensional or three-dimensional aspect. The term "control" can be defined as a handle to an object which can adjust one or more attributes or references to the object. The term "control action" can be defined as a button press, a soft-key press, a selection, a scroll, an entry for activating a control. The term "jitter movement" can be defined as a brief localized motion. The term "absolute location" can be defined as a one to one mapping of a first location to a second location. The term "relative location" can be defined as a second location in relation to a first location, or a displacement in a sensory space. The term "acquire" can be defined as creating a handle to an object. The term "select" can be defined as selecting an object that has been acquired. The term "handle" can be defined as a reference to an object. The term "touchless" can be defined as not requiring physical contact. The term "touchless control" can be defined as a control that can be handled and selected without requiring touching of an object, although actual physical contact may be made. The term 'sign' can be defined as drawing a pattern in air using a finger, such as sign language, but using a finger instead of a hand. The term "signing" can be defined as the act of moving a finger in the air to draw a character, letter, or symbol. The term 'trace' can be defined as a representation of a sign in feature space, wherein the representation contains salient features of the finger movement. The term "finger gesture" can be defined as a finger sign for performing an action. The term "pattern" can be defined as an outline or contour that is repeating or non-repeating, and can be an alphanumeric character such as a letter, a number, or character. The term "pause" can be defined as a temporary pause.

Referring to FIG. 1, a sensor device 110 is shown. In one arrangement, the sensor device 110 can be used in conjunction with a mobile device 100. The mobile device 100 may be a cell phone, a portable music player, a memory storage unit, a security device, a personal digital assistant, a laptop, a notebook computer, or any other suitable communication device. The sensor device 110 can attach to the mobile device 100 as an external accessory, or it can be internal to the mobile device. The sensor device 110 can generate a touchless user interface that allows a user to interact with the mobile device 100 through touchless finger actions. In one aspect, a finger action may be a finger sign, or a finger gesture. The sensor device can also project a touchless user interface on a surface of the mobile device 100.

Figure 2:
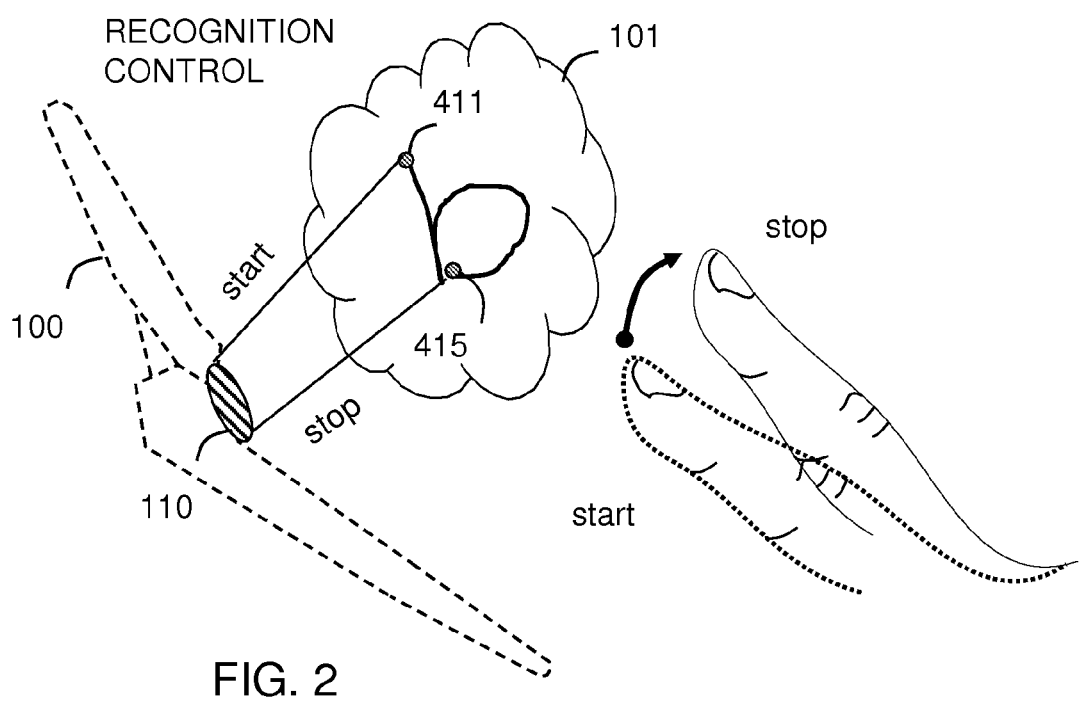
FIG. 2 is an illustration of a touchless sensing space generated by the sensor device of FIG. 1 in accordance with an embodiment of the inventive arrangements.

As shown in FIG. 2, the sensor device 110 can generate a touchless sensing space 101 wherein a user can interact with the mobile device 100 via touchless finger movements or gestures. A user can position a finger within the touchless sensing space 101 to interface with the mobile device. The touchless sensing space 101 can be separate from any surface of the mobile device, display, or keypad. In such another arrangement, the touchless sensing space can be selected to provide a touch screen or a touchpad behavior. As an example, a user can motion a finger sign or a finger gesture for acquiring and handling a control of the mobile device in the touchless sensing space, or on a surface of the mobile device having a projected touchless sensing space. In another aspect, the sensing device 100 and sensing field 101 allow a user to perform touchless character recognition. For example, a user can move the finger in the touchless sensing space 101 and draw out a character. The sensing device 110 can recognize the character from the finger movement, and enter the character into an application such as a notepad application, an email message, a dictation application, or any other application which can process textual information, such as letters, characters, of symbols. In such regard, a user can compose a text message letter by letter via touchless finger movements. In another aspect, finger gestures can represent words. In such regard, a user can compose a text message word by word via finger gestures. In another aspect, the finger gestures can perform control actions on the phone, such as automatically performing a hot-key operation to access a menu control.

Figure 3:
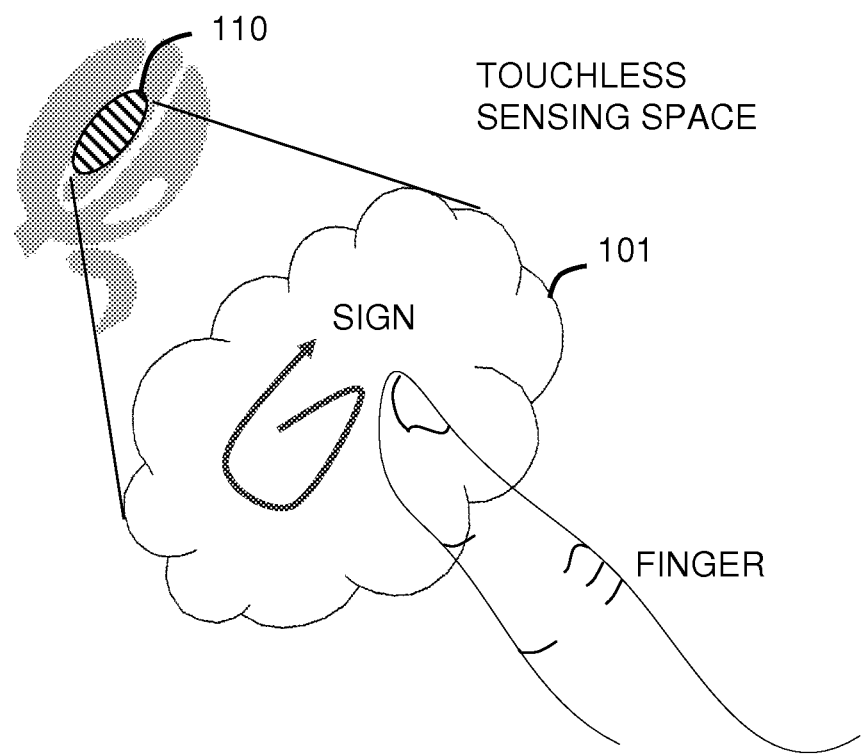
FIG. 3 is a headset for recognizing touchless finger movements and gestures in accordance with an embodiment of the inventive arrangements.

In another arrangement the sensor device 110 is shown for use with a headset 121, as shown in FIG. 3. The sensor device 110 may be attached to the headset 121 or integrated within the headset 121. The headset may be a standalone device capable of controlling all aspects of audio or media associated with the headset 121. The headset device can also be an earpiece or other hearing device that fits within or attaches to the ear. The headset 121 may be wireless Bluetooth enabled, allowing for short range communication with another device, such as the mobile device 100. In one aspect, the mobile device 100 may determine how controls of the headset 121 are adjusted. That is, options for adjusting controls on the headset may be available through the mobile device 100. The sensing unit 110 can send commands through a wireless communication link of the headset 121 to the mobile device 110. The commands can be received by the mobile device 100 for adjusting the controls of the headset 121, if the headset does not have administrative privileges to do so. For example, the headset 121 may have only limited controls such as a volume due to the small size of the headset 121. The sensing unit 110 can send commands to the headset 121 or the mobile device 100 for performing other features, such playing a voice mail, or scrolling through messages. In another arrangement, the headset 121 has complete control over audio and media managed by the headset 121. For example, a user can change a control on the headset directly 121 without going through a mobile device 100. In any case, a user can operate the headset 121 via touchless finger movements or gestures within the touchless sensing space 101.

Figure 4:
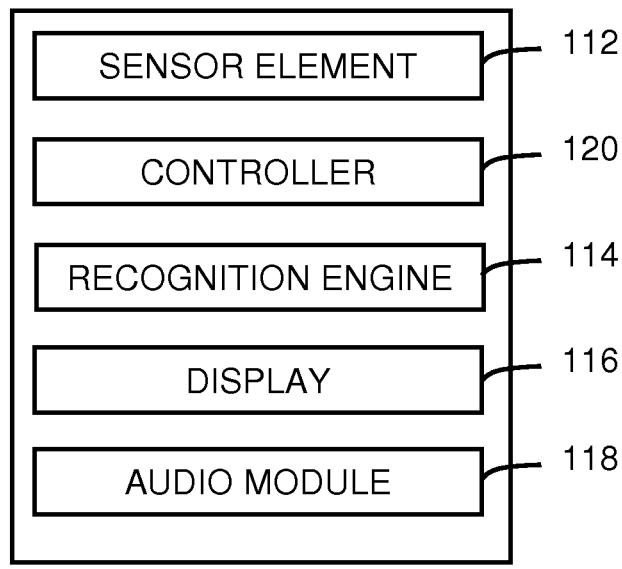
FIG. 4 is a block diagram of a sensor device in accordance with an embodiment of the inventive arrangements.

Referring to FIG. 4, a block diagram of the sensor device 110 is shown. The sensor device 110 may contain more or less than the number of components shown, and is not limited to those shown. The sensor device 110 can be created in accordance with the touchless sensing unit described in U.S. Patent Application 60/740,151 and U.S. Patent Application 60/740,358 by the same inventor and hereby incorporated in entirety by reference. Components of the sensor device 110 associated with recognizing finger movement and control are shown in FIG. 4. The sensor device 100 can include at least one sensor element 112 for tracking a movement of the finger in the touchless sensory space 101, a controller 120 for creating a trace of the movement, a recognition engine for identifying at least one pattern in the trace, a display 116 for displaying the at least one pattern, and an audio module 118 for audibly presenting the at least one pattern. Notably, all components do not have to be included together, as some components can operate independently of others, or without reliance on the other components.

Briefly, the sensor device 110 can comprise one or more transmitters and receivers as sensing elements, such as an array of ultrasonic transducers, micro-acoustic microphones, micro speakers, or micro-electro mechanical MEMS microphones for transmitting and receiving audio signals. In another arrangement, the sensors can be CCD camera elements, CMOS floating gates, optical elements, LED elements, or MEMS camera elements for receiving light. The sensing elements are spaced sufficiently close together to fit on the mobile device 100 or the headset 121. The sensing device 110 can identify an absolute location or relative movement of a finger in the touchless sensing space 101. The sensing space can be created in accordance with a touchless sensing unit described in U.S. Patent Application 60/779,868 by the same inventor and hereby incorporated by reference. In one arrangement, but not herein limited, the sensing space can be generated based on principles of echo-location detection as is described in U.S. Patent Application 60/740,358 by the same inventor and hereby incorporated by reference. It should be noted, that the overall size of the sensor device 110 is reduced for placement on the mobile device 100 or the headset 121.

The controller 120 can be operatively connected to the sensor element 112 for receiving finger movement information. For example, the sensor element 112 can send an absolute location or a relative displacement of the finger in the touchless sensing space 101. The controller 120 and the recognition engine 114 may be implemented in software by a processor such as a microprocessor or a digital signal processor (DSP), or any other suitable electronic device. The controller 120 and the recognition engine 114 may also be implemented in hardware such as an Application Specific Integrated Circuit (ASIC) or Field Programmable Gate Array (FPGA), or any other suitable hardware. The ASIC can be digital or analog based. The location and displacement may be represented as Cartesian coordinates, pixels, time, or distance. The sensor device 110 may also include a memory for storing data, such as tracking information.

Figure 5:
FIG. 5 is a recognition engine in accordance with an embodiment of the inventive arrangements.
Figure 6:
FIG. 6 is an audio module in accordance with an embodiment of the inventive arrangements.

The recognition engine 114 can recognize a pattern from the finger movement creating the finger sign or finger gesture. For example, a user may sign a character, such as the letter 'a' in air in the touchless sensing space 101. The recognition unit 114 can recognize the 'a' pattern from a trace of the finger movement and output the letter 'a' as a result, for example, to the display 116. The recognition engine 114 can recognize any pattern such as an alphanumeric character or a finger gesture. Referring to FIG. 5, the recognition engine 114 can include a neural network 200. In one arrangement, the neural network 200 can be a multilayer perceptron having an input layer, at least one hidden layer, and an output layer. The neural network 200 may be of other topologies such as a radial basis network, a time delay recurring neural net, or a principal component analysis front end neural network. The neural network 200 can be trained on a database of finger signs and finger gestures. The training may be user dependent or population dependent. In one arrangement, the neural network 200 can use a delta-bar momentum rule and back-propagation for minimizing a mean square error during training. The neural network 200 can also include a self-organizing feature extractor (not shown) or a principal component feature extractor (not shown) for reducing a dimensionality of an input vector. The neural network 200 can be trained off line, and the weights saved on the sensor device 110, or any other device providing communication to the sensor device 110.

In practice, the recognition engine 118 attempts to recognize a finger sign or a finger gesture. The recognition engine 114 can make mistakes in classifying the pattern. For example, the recognition engine 114 may mistakenly recognize an ampersand sign (e.g. &) as a numerical figure eight (e.g. 8). The display unit 116 can display the recognized pattern, which may or may not be the correct pattern. This allows the user to visualize the pattern recognized by the recognition engine 114. If the pattern is incorrect, the user can speak a voice command (e.g. "no") to inform the recognition engine 114 of the error. The audio module 118 can also include a voice recognition engine 124 for interpreting the voice command. The voice recognition engine 124 can accept or reject a pattern recognized by the recognition engine 114. The controller 120 can then discard the pattern, and the recognition engine 114 can present another pattern. If the pattern is correct, the user can speak a voice command (e.g. "yes") to inform the controller 120 to accept the pattern. The voice recognition engine 124 can be used in conjunction with the sensor device 110 to enhance an interactive experience. In one aspect, the user does not need to speak a voice command to accept the pattern. A default operation can automatically accept the pattern unless a voice command to reject the pattern is received.

Figure 7:
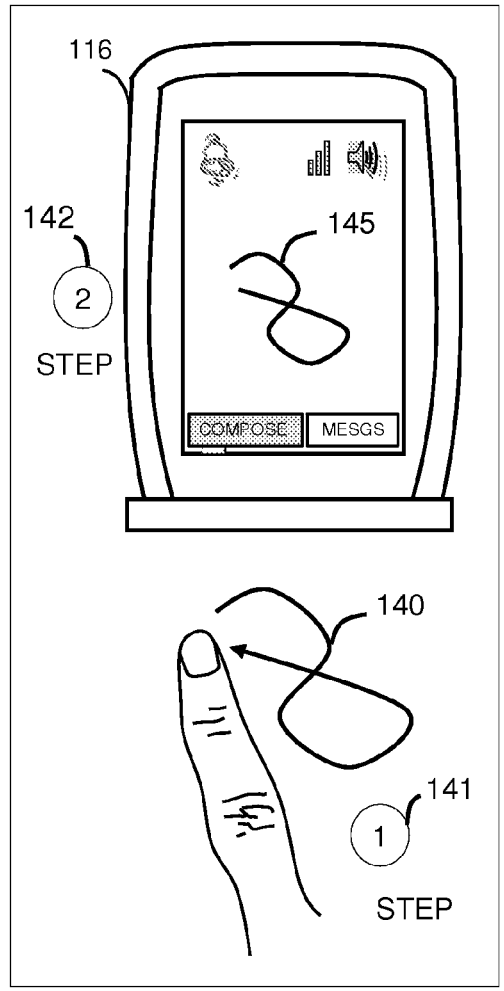
FIG. 7 is a depiction for touchless finger signing in accordance with an embodiment of the inventive arrangements.
Figure 8:
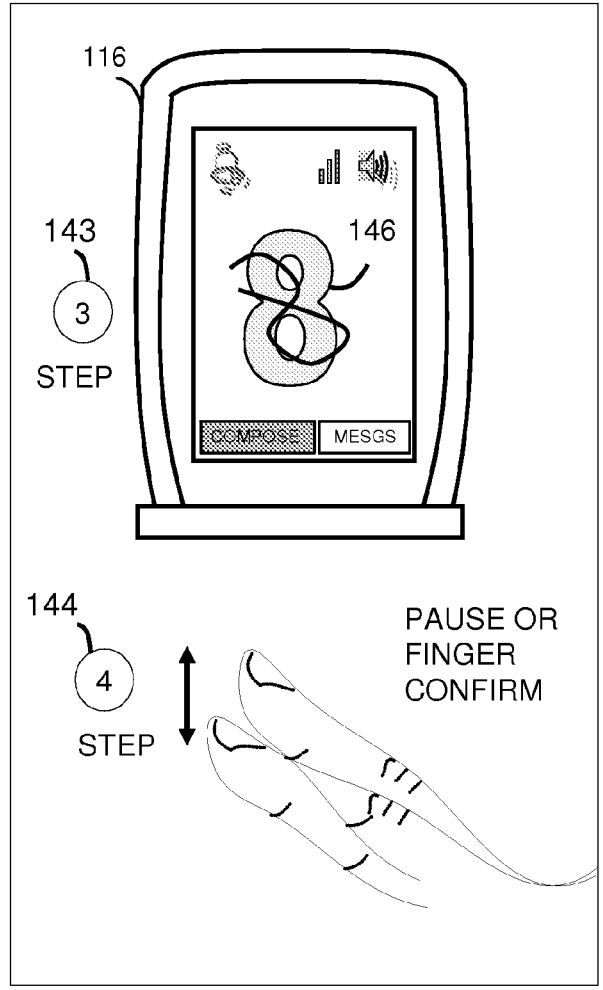
FIG. 8 is a state model for touchless control in accordance with an embodiment of the inventive arrangements.

Referring to FIGS. 7 and 8, an exemplary depiction for touchless character recognition on a mobile device is shown. In particular, the depiction of FIG. 7 illustrates user steps associated with generating a finger sign, capturing a trace of the finger sign, and displaying the trace. The depiction of FIG. 8, illustrates steps of displaying a pattern recognized from the trace, and accepting the pattern. As an example, referring to FIG. 7, at step 141, a user can sign a symbol 140, such as a character, a letter, a numeral, or a finger gesture (the sensor device 110 can recognize alphanumeric characters, which comprise letters, characters, and other symbols). Notably, the finger is in the touchless sensing space 101 of the sensor device 110 (See FIG. 1) and is not in physical contact with a surface of the mobile device 100. That is, the finger is not resting on a touchpad or a keypad of the mobile device 100. The finger is in the air above the mobile device 100 as shown in FIG. 2. At step 142, a trace 145 can be produced on the display 116 of the mobile device. Briefly, the controller 120 tracks a movement of the finger in the touchless sensing space and creates a trace from the finger movement. The controller 120 can also identify finger start and finger stop actions from the trace for cropping the trace for the recognition engine 114. That is, the controller 120 can identify when the trace 145 begins and when the trace ends.

The trace is a feature vector of the finger sign. The trace is not merely a one to one physical tracing of the finger movement in the air. The trace is a feature vector which has characteristic features. In one aspect, a projection of the trace can be presented to represent the finger movement. At step 143, the recognition engine 114 can determine a pattern 146 associated with the trace 145, and the controller 120 can display the pattern 146 on the display 116. As shown, the pattern 146 may be the number eight ("8") which may be the sign 140 the user intended. Referring to FIG. 8, at step 144, the user can accept the pattern 146 by either pausing the finger or by moving the finger up and down. In such regard, the finger motion resembles a head motion of the user saying "yes".

In another aspect, the user can reject the pattern 146 by moving the finger left and right, such as a person saying "no" by moving their head left and right. Notably, the finger confirm sign can be selected by the user and is not limited to the embodiments shown. In another arrangement, finger discard actions can be associated with rejecting the pattern.

Figure 9:
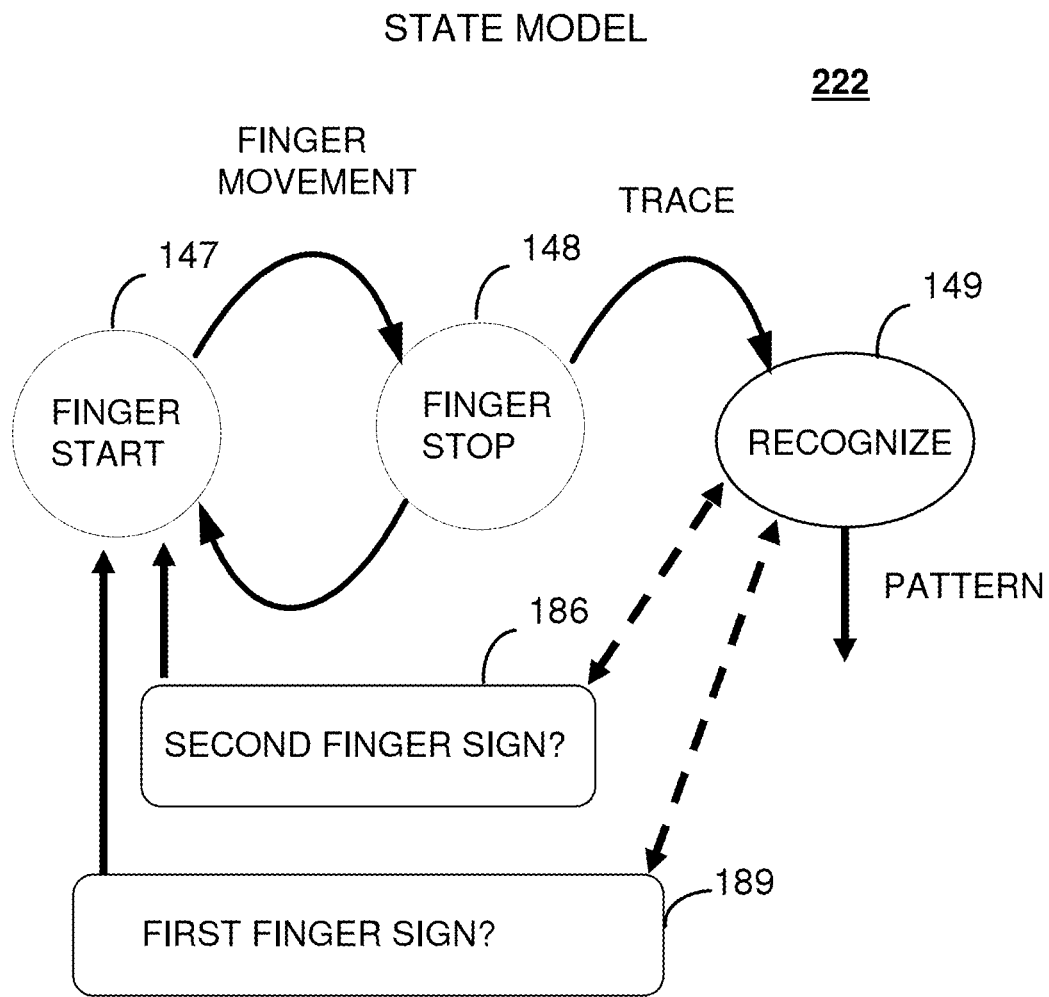
FIG. 9 is a differential trace of a finger movement in accordance with an embodiment of the inventive arrangements.

Notably, the controller 120 recognizes when a finger sign corresponds to presenting a character, and when a finger sign corresponds to accepting or rejecting a pattern. Notably, the controller 120 keeps track of the patterns the recognition engine 114 identifies. That is, the controller 120 can operate using a state machine that determines how the recognized patterns should be interpreted in the context of a touchless user interface session. Referring to FIG. 9, a state diagram model 222 is shown. The state diagram model 222 can be in a finger start 147 state, a finger stop state 148, or a recognition state 149. When the controller 120 is in a finger start state 147, it is attempting to determine a finger stop motion. Upon identifying a finger stop motion, the controller proceeds to the finger stop state 148. The controller 120 can then generate a trace from the finger sign, and then proceed to the recognition state 149. Following, the recognition engine 149 can recognize the pattern given knowledge of which finger sign 187 it is trying to recognize. Knowledge of the finger sign 187 can help the recognition engine reduce the number of pattern matches For example, a first finger sign 189 may be a letter between 'a' and 'z'. A second finger sign 186 may be presented upon completion of the first finger sign 189. Accordingly, the recognition engine has at least 26 patterns to match. In contrast, if the finger sign is for accepting a recognized pattern, the recognition engine may have only a few patterns to match, such as up/down or left/right. In practice, the controller 120 keeps track of which finger signs correspond to generating a character via touchless finger movement, and which finger signs correspond to accepting or rejecting a recognized character.

The controller 120 can also communicate with the recognition engine 114 to determine if a recognized pattern corresponds to a character, such as a finger sweep motion of a letter, or to a finger confirm action, such as a finger up and down movement. Notably, the recognition engine 114 can distinguish between finger signs for characters and finger signs for accepting a recognition. In such regard, the recognition engine 114 and the controller 120 work together to determine finger signs. This allows the controller 120 to keep track of what signs can be expected. For sequential finger sign movements, the state model 222 is not limited to the states shown. That is more states can be added as the depth of the finger control is increased. For example, a touchless user interface operation may require a sequence of three different finger signs. Accordingly, the state diagram 222 can include at least three states for providing control.

Figure 10:
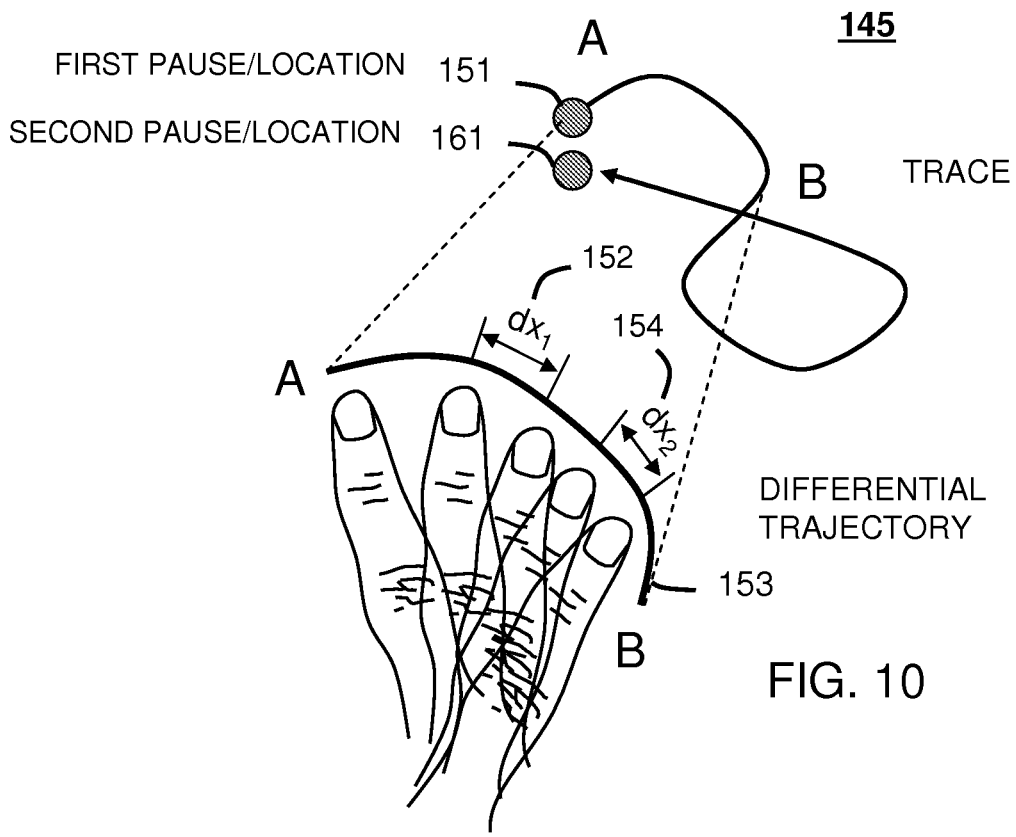
FIG. 10 is a positional trace in accordance with an embodiment of the inventive arrangements.

Referring to FIG. 10, an exemplary trace 145 is shown. The trace 145 can be defined by a start point A 151, and a stop point B 161. The trace 145 is a feature vector that can be processed by the recognition engine 114. In particular, the trace 145 contains features that are salient for characterizing the finger movement 140 (see FIG. 7). A salient characteristic may be representative of a group or an individual person. For example, some individuals draw a figure eight starting at the top, moving to the right, sweeping down to the left, sweep at the bottom, moving up the right and across to the left, and closing from at the top. Others may do the reverse. A salient characteristic can be the direction and the style by which the character is drawn. As illustrated, the trace 145 has a contour similar to the finger movement 140. This is for illustrative purposes only, and is not limited to being of a form similar to the finger movement 140. The finger movement 140 can be displayed on the display 116, but the features underlying the trace 145 are not necessarily presented on the display 116. In one arrangement, as shown, the trace is a loci of points (x,y,z) defining the location of the finger in the three dimensional sensory space 101. In this case, the trace is an actual representation of the finger movement in the touchless sensing space 101.

Figure 11:
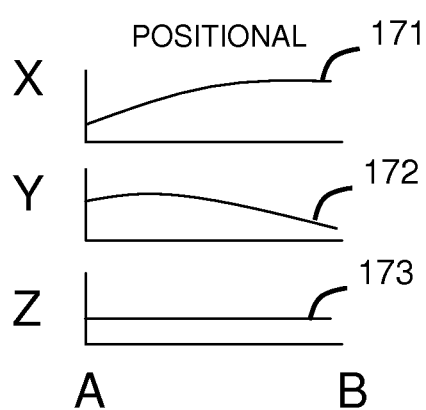
FIG. 11 is an acceleration trace in accordance with an embodiment of the inventive arrangements.
Figure 12:
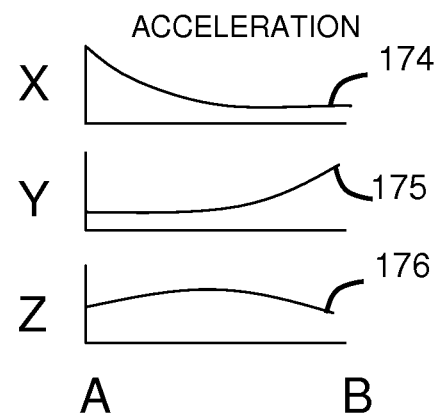
FIG. 12 is a neural network for recognizing a pattern from an input created via touchless finger movement in accordance with an embodiment of the inventive arrangements.
Figure 13:
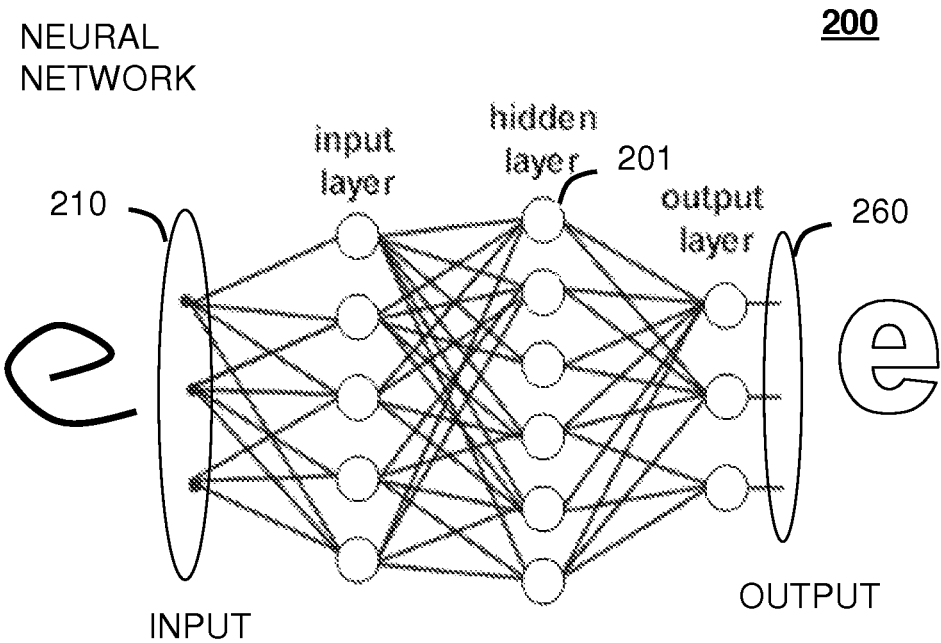
FIG. 13 is set of traces input to the neural network of FIG. 10 in accordance with an embodiment of the inventive arrangements.

In another arrangement, the trace can also include, or solely comprise, a differential trajectory 153 of the finger movement in the three-dimensional sensory space 101. For example, the trace can be a vector (dx,dy,dz) of the finger movement over time. Referring to FIG. 11, exemplary direction traces for an X 171, Y 172, and Z 173 component are shown (e.g. Cartesian coordinates). The traces in FIG. 9 reveal the dx, dy, and dz values over time which can be stored as a matrix or a single vector. Referring to FIG. 12, exemplary acceleration traces for an X 174, Y 175, and Z 176 component. Notably, the differential trajectory 153 is characterized by the direction traces of FIG. 11 and the acceleration traces of FIG. 12. In such regard, the trace 153 includes spatial and temporal information. That is, the differential trajectory 153 includes, direction, velocity, and acceleration.

For instance, referring back to FIG. 10, $dx_2$ 154 is shorter than $dx_1$ 154 due to a slower finger movement on the outside curve of the figure eight in the region of $dx_1$ 154. That is, the finger moves over a larger distance in the same amount of time at a first location (dx 152) than at a second location (dx 154) due to the finger movement. Notably, the acceleration may be different for different characters and individuals. The recognition engine 114 can account for these differences. The acceleration feature and the differential trajectory can give the recognition engine 114 additional information for classifying the finger sign as a pattern. Notably, this temporal information (e.g. differential component) can provide characteristics of the finger sign unique to the generation of the finger sign. That is, the user may generate the finger sign 140 with the same handwriting style, which constitutes not only location information but also rate of change information.

For example, consider that the finger sign 140 is uniformly spaced based on location alone. In such regard, the recognition engine 114 would determine that the generation of the finger sign in the touchless sensing space was of constant velocity. This is similar to imagining the finger moving at constant velocity throughout the generation of the character, or letter. This does not provide good discrimination properties since all traces will be considered at the same speed. Now consider, that the finger sign 140 is sampled uniformly during generation of the finger sign. The sampling can also be varied in accordance with linear prediction or adaptive methods. In this case, temporal information, such as velocity and acceleration, can be captured in the sampling. In contrast, this does provide good discrimination properties since the traces are generated at different speeds along different features. In such regard, the recognition engine 114 can identify changes in acceleration along the finger sign, in addition to having the loci of points representing the pattern. Due to the differential information, the recognition engine 114 is provided additional information for recognizing characteristics of the finger sign that are unavailable with position information alone. This is similar to imagining different people having different writing styles. Each person may write the letters at a different speed and with a different textual articulation. The additional stylistic information conveyed by the rate of change helps the recognition engine 114 classify the finger swipe as a pattern, since it can be unique to the writing style.

Referring to FIG. 12, an exemplary neural network 200 is shown. The neural network 200 can be included within the recognition engine 114. The neural network 200 can include an input layer, at least one hidden layer, and an output layer as is known in the art. Each of the layers can include processing elements 201 receiving synaptic connections (e.g. connection lines) from other processing elements. The processing elements 201 can provide a summation and an activation function for compressing a summed input to the processing element. Broadly stated, the compression function allows each processing element to model one feature of the input. Each of the synaptic connections can have an associated weight. In practice, an input signal is applied at an input 210 of the neural network 200 and an output is produced at an output 260 of the neural network 200. If the neural network 200 is properly trained, the neural network can perform recognition tasks such as recognizing a pattern from a trace. Training constitutes presenting input data to the neural network with corresponding desired outputs. During training, the neural network 200 adapts the weights of the synaptic connections to minimize an error between a generated output and the desired output. The neural net 200 can be trained with a back propagation algorithm that distributes errors to processing elements based on their learning performance. In general, the back-propagation algorithm performs a noisy gradient descent to find the synaptic weights that minimize an error in a performance surface, as is known in the art. Neural networks 200 are sensitive to initial weights and to the input patterns. The neural network 200 can also include a feature extractor front end such as a self-organizing map or a principal component analysis (PCA) front end (neither shown) to reduce a dimensionality and improve training performance and recognition. Alternatively, a robust feature set can be provided specific to the recognition task without use of a front-end feature extractor or as a complementary process to the front-end.

Figure 14:
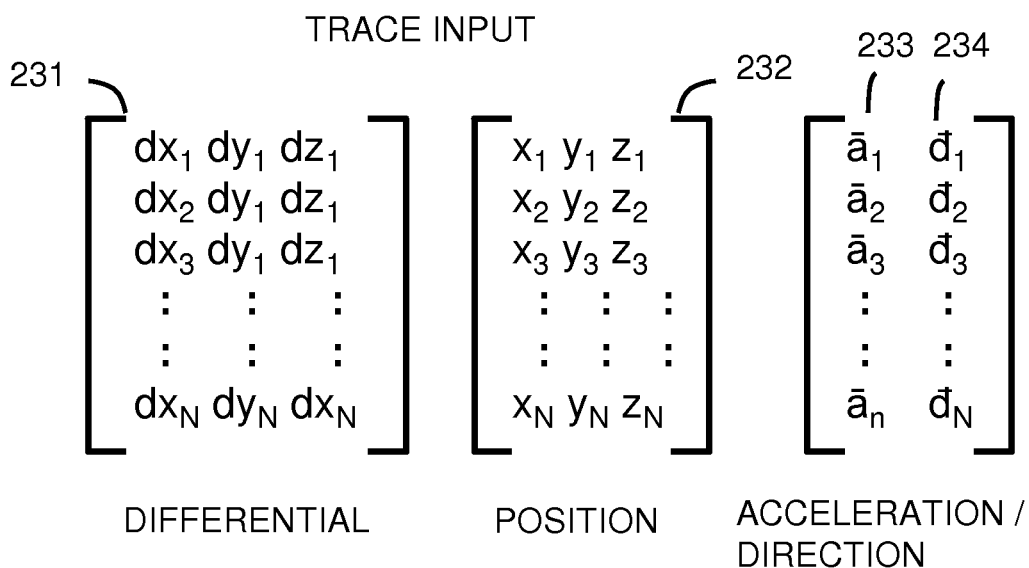
FIG. 14 is a bit-map input to the neural network of FIG. 10 in accordance with an embodiment of the inventive arrangements.

The trace 145 is a robust feature vector that can be input to the neural network 200 for training and recognition. The feature vector contains spatial and temporal information that is unique to a writing style in a touchless sensory space 101. Notably, writing in a touchless sensory space 101 is not analogous to writing on a surface such as a piece of paper. Touch based writing introduces stiction, which applies resistance on the writing movement. In touchless writing, there is no resistance. Accordingly, a person's writing style in a three-dimensional touchless space is not analogous to the person's writing style on a two-dimensional surface. A touchless writing style provides features the neural network 200 can discriminate. That is, the neural network 200 can learn features of the trace 145 for recognizing the trace due to the touchless sensing. Recall, the trace 145 includes spatial and temporal information based on sampling the trace while the trace is generated. That is, the trace can be generated in real-time. The effective sampling rate can also be changed by selectively discarding samples, as one implementation. As previously discussed, the trace 145 can be a differential trajectory that captures stylistic information of the user, when the user is generating the finger sign or finger gesture. Referring to FIG. 14, the input 210 to the neural network 200 can be a differential trajectory trace 231, a position trace 232, an acceleration trace 233, or a direction trace 234. The input 210 can be just one of the aforementioned traces or a combination of the traces. The number of inputs to the neural network 200 are the number of elements in the trace. Notably, combining feature sets can improve a discrimination of the neural network 200.

Figure 15:
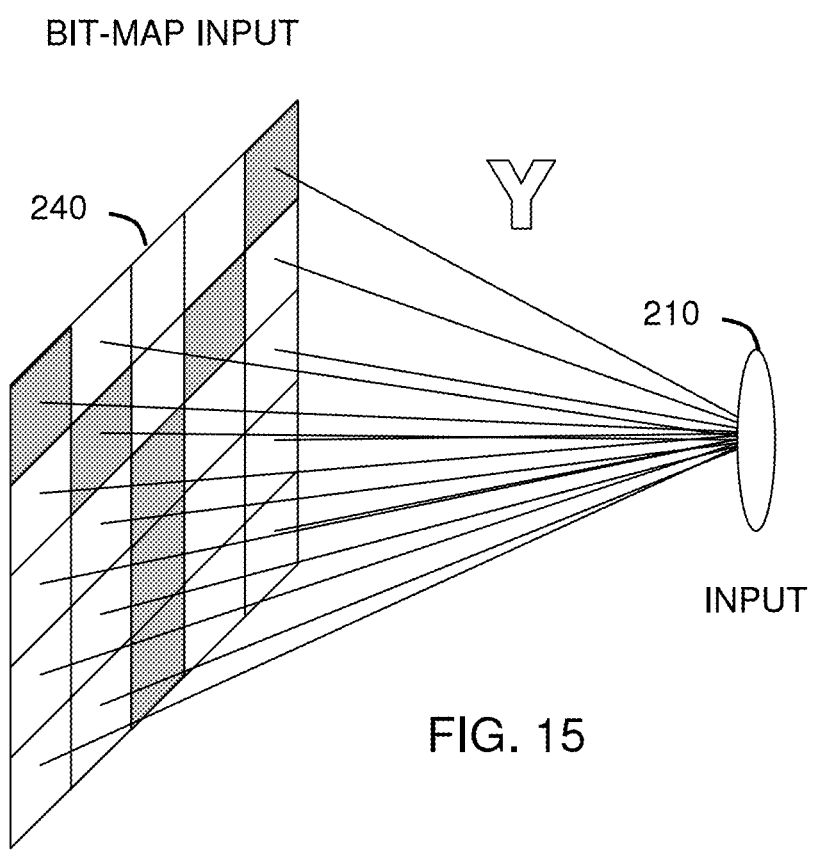
FIG. 15 is a method for touchless finger signing based on a first pause and a second pause in accordance with an embodiment of the inventive arrangements.

Referring to FIG. 15, the input 210 to the neural network 200 can also be a bit-map 240 of the finger movement 140. For example, the finger movement 140 defined by the loci of points (x, y, and z) can be superimposed on a grid of binary values having a reduced dimensionality. For example, the finger movement 140 may be sampled at 100 Khz and the bit-map 240 grid can be 5×5 (25 input points). Notably, the bit-map 240 provides a significant reduction in the number of inputs to the neural network 200. Reducing the number of inputs, also reduces the number of synaptic weights needed for storage, and accordingly, for recognizing finger signs. The bit-map however does not inherently include trace information such as differential trajectories. In particular, temporal information is not included in the bit-map 240 using superposition. Accordingly, the differential trajectories can be included as supplemental input with the bit-map 240 to the neural network 200 to improve discrimination performance.

Figure 16:
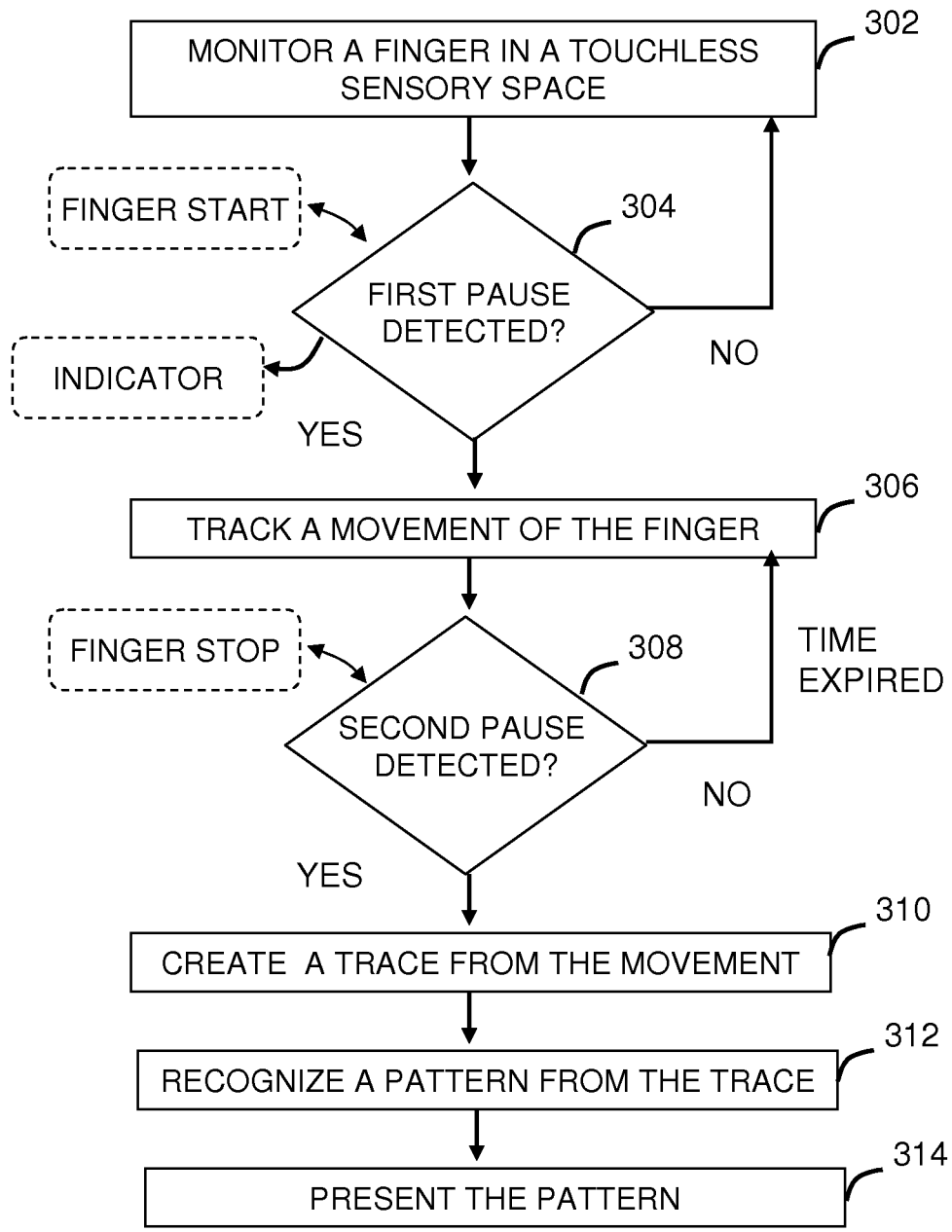
FIG. 16 is an illustration for finger signing on a mobile device in accordance with an embodiment of the inventive arrangements.

Referring to FIG. 16, a method 300 for touchless finger signing is shown. The method 300 can be practiced with more or less than the number of steps shown. To describe the method 300, reference will be made to FIGS. 1, 2, 4, 13, 17 and 18 although it is understood that the method 300 can be implemented in any other suitable device or system using other suitable components. Moreover, the method 300 is not limited to the order in which the steps are listed in the method 300. In addition, the method 300 can contain a greater or a fewer number of steps than those shown in FIG. 16.

At step 302, a finger movement in a touchless space can be monitored. For example, the user may extend a finger in the touchless sensing space 101 for performing finger signing. In one arrangement, the user may hold the mobile device 100 in one hand, and perform touchless finger movements with a finger of the other hand. In another arrangement, the user can hold the phone, and with the same hand, extend the thumb into the touchless sensing space 101 for performing touchless finger recognition. One such application is to enter an address for navigation systems, enter a phone number for dialing, enter characters for text messaging via touchless finger signing without touching the mobile device.

At step 304, a first pause can be detected. A first pause generally occurs when the user positions the finger at a first location to begin a finger sign. The first pause corresponds to the start of the finger sign. For example, referring to FIG. 2, upon the finger entering the touchless sensing space 101, the user can pause the finger to acquire touchless control. In particular, the controller 120 can determine when finger has paused. If a pause is detected, the controller 120 can enter a capture state. If a first pause is not detected, the controller 120 can continue to monitor the finger movement. The controller 120 (see FIG. 4) may contain a timer (not shown) or other logic unit for determining how long the finger has stayed at the same position; that is, pause. In one arrangement, the sensing unit 110 can send coordinates to the controller 120. The controller can determine that the finger is stationary from the coordinates. An indicator can be presented to the user, to inform the user that recognition control has been acquired. For example, the display 116 can present a visual indicator such as a start location, or the audio module 118 can present an audible indicator, such as a sound. After the user interprets the indicator, the user can proceed to generate a character via touchless finger movement.

Figure 17:
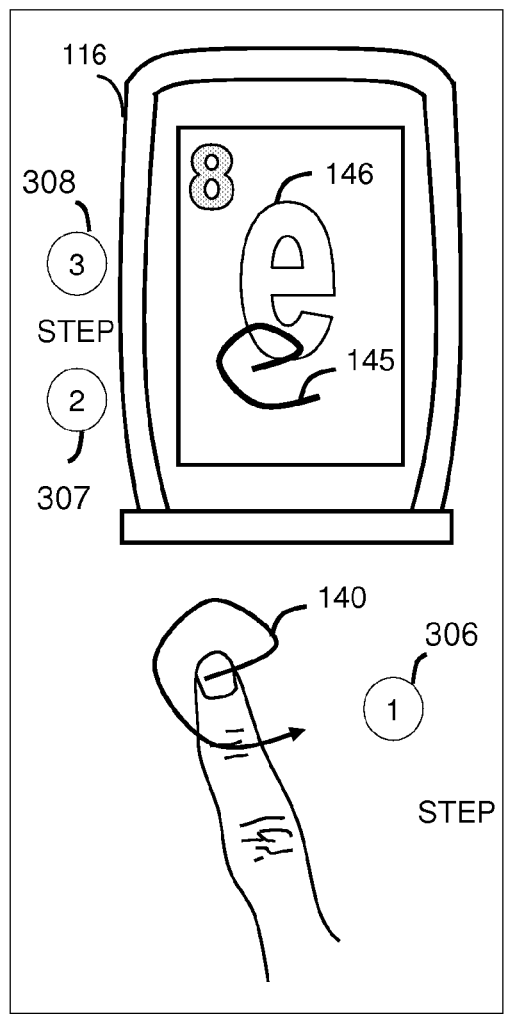
FIG. 17 is an illustration for accepting or rejecting a recognized pattern in accordance with an embodiment of the inventive arrangements.

At step 306, the movement of the finger can be tracked. The finger is tracked during the generation of the finger sign. Tracking refers to capturing absolute or relative movement information. For example, referring back to FIG. 9, the controller 120 can track the progression of the finger movement after the point A 151. As the finger moves, the sensing unit 110 can provide coordinates of the finger in the touchless sensing space 101. The controller 120 can keep a history of the coordinates as the coordinates are received. The controller 120 can also adjust the sampling rate for receiving the coordinates in accordance with an acceleration of the finger. Referring to FIG. 17, an example character recognition application is shown. In the example, the user generates the finger sign 'e', The movement of the finger sign is tracked, corresponding to step 1 (306). The finger movement can also be presented on the display, such as a positional trace 145. The trace 145 can be presented on the display as the finger is moving as shown by step 2 (307), At step 308, a second pause can be detected. The second pause generally occurs when the user has completed the finger sign. The second pause signifies that the user has generated the finger sign. For example, referring back to FIG. 9, the controller 120 can track the progression of the finger movement to point B 161. A reset mechanism can also be employed if a second pause is not identified within a time expiration. Again, the controller 120 can determine that the finger movement has ceased, and the finger has paused.

Upon detecting a second pause, at step 310, a trace can be generated. The controller 120 can generate the trace in accordance with the description of FIG. 10. In particular, the trace 145 can include spatial (directional information) and temporal information (acceleration information). As previously noted, the trace 145 can be a directional vector, a differential trajectory, a positional vector, or an acceleration vector, or a combination of all. The trace 145 contains features that are salient for recognition by the neural network 200. Continuing with the example of FIG. 17, the positional trace 145 can be rendered on the display 116. In such regard, the user can receive visual feedback of the trace as the trace is being generated. The presentation of the trace 145 on the display 116 can occur in real-time, such that the trace 145 is displayed as the user generates the finger sign 140.

Referring back to FIG. 16, at step 312, a pattern can be recognized from the trace. The pattern, is the character, letter, or symbol associated with the finger sign. For example, if the finger sign is a figure eight, the recognized pattern will be the number '8'. At step 314, the pattern can be presented to the user. For example, referring to FIG. 17, at step 3 (308) the controller 120 can present the pattern on the display 116. Alternatively, the audio module 118 can produce an audible rendition of the pattern. Briefly, it is the controller 120 that submits the trace 145 as input 210 to the neural network 200 (See FIG. 12). The neural network 200 then recognizes the pattern from the trace 145 and generates the recognized pattern 146. Upon completion of step 312, the user has generated a finger sign 140, visualized a trace 145 of the finger sign on the display, and received a recognized pattern 145 on the display. The pattern 145 corresponds to the character, letter, or symbol the recognition engine 114 recognized from the trace 140. In the foregoing, methods for allowing the user to accept or reject the pattern 145 are presented.

Figure 18:
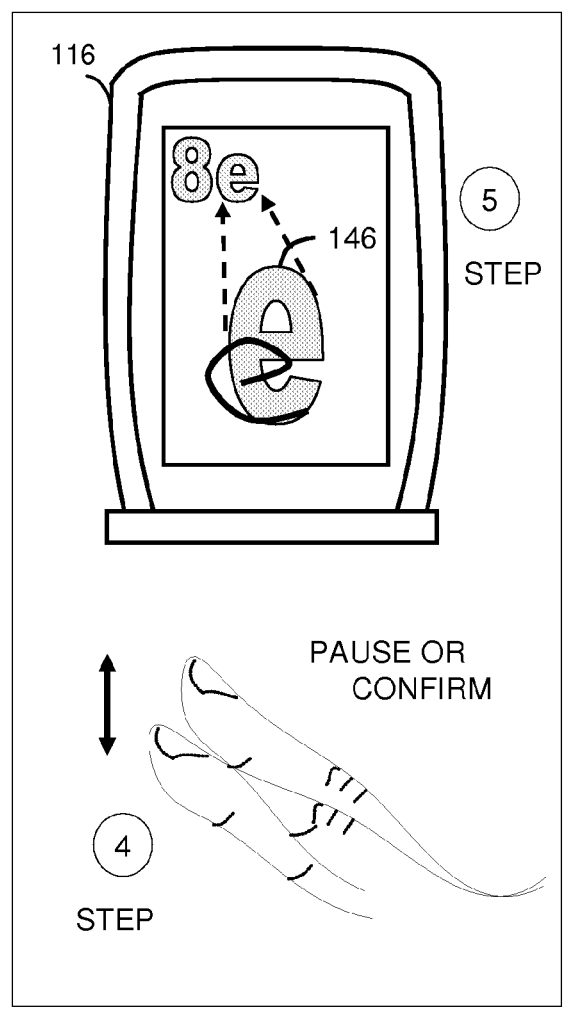
FIG. 18 is a method for accepting or rejecting a pattern based on a continued finger pause in accordance with an embodiment of the inventive arrangements.
Figure 19:
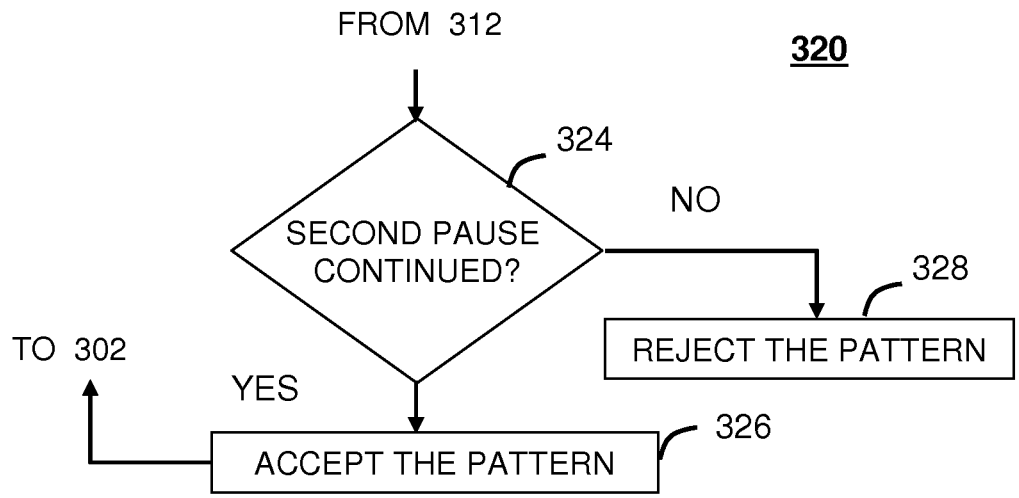
FIG. 19 is a method for accepting or rejecting a pattern based on a finger discard action in accordance with an embodiment of the inventive arrangements.

Referring to FIG. 19, an auxiliary to the method 300 is shown. Briefly, the method 320 allows a user to accept a recognized pattern without further finger action. At step 324, a determination can be made as to whether the second pause is continued. If the second pause (308) is continued, the pattern is accepted at step 326. If the second pause (308) is not continued, the pattern is rejected. For example, referring to FIG. 18, the accept or reject control condition is illustrated. As illustrated, the trace 145 and the pattern recognized 146 are shown on the display 116. The illustration follows from FIG. 17. It should also be noted that the finger is at the second paused position (308), corresponding to the end point B 161 of the trace 145 (See FIG. 10). If the user leaves the finger at the same location (i.e. continues pause), then the pattern 146 is accepted. That is, the user acknowledges the pattern and accepts the recognition of the pattern (326). If the user moves the finger away, then the pattern is rejected (328). This allows the user to rapidly enter finger signs without confirming each recognized pattern. For example, once the pattern is accepted, the method 320 continues to 302 to monitor finger movement for the next finger sign.

Figure 20:
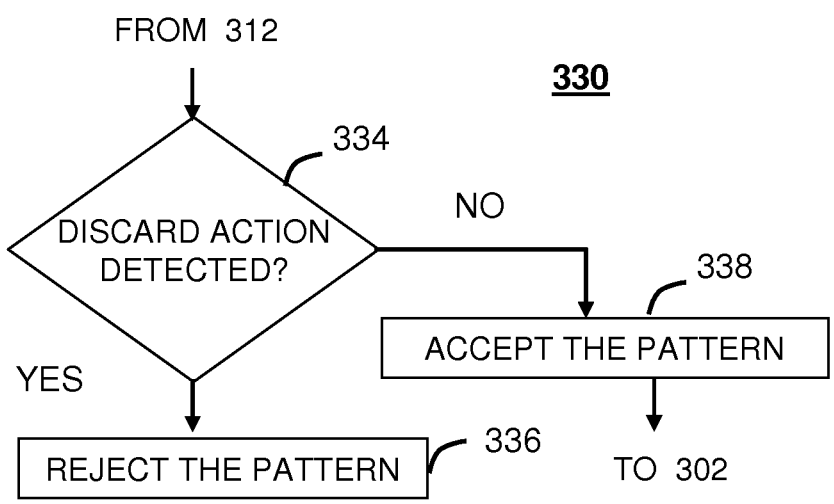
FIG. 20 is a method for accepting or rejecting a pattern based on a finger confirm in accordance with an embodiment of the inventive arrangements.
Figure 21:
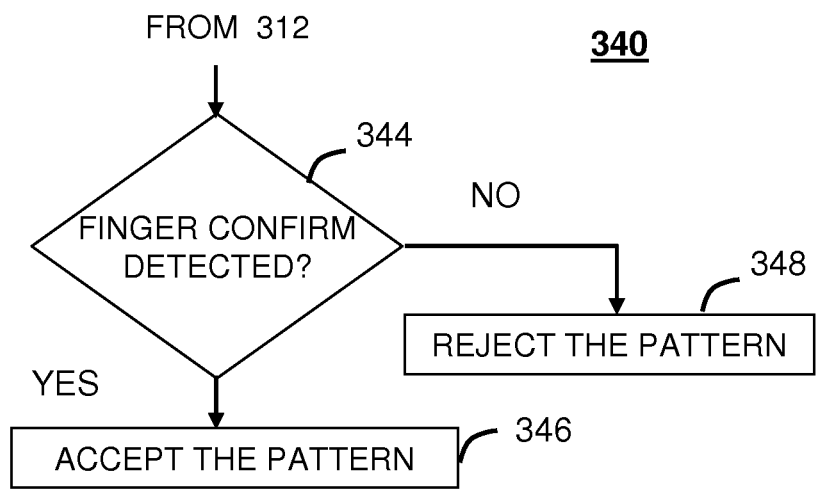
FIG. 21 is a method for accepting or rejecting a pattern based on a voice command in accordance with an embodiment of the inventive arrangements.

Referring to FIG. 20, another auxiliary to the method 300 for touchless acceptance and rejection is shown. Briefly, the method 330 allows a user to accept a recognized pattern by issuing a finger discard sign. At step 334, a discard action can be detected. If a discard action is detected, the pattern is rejected at step 336. The finger discard action can be a back and forth finger movement signifying a "no". If the discard action is not detected, the pattern is accepted at step 338. The method can then continue to step 302 to acquire a next finger sign. Referring to FIG. 21, yet another auxiliary to the method 300 for touchless acceptance and rejection is shown. Briefly, the method 340 allows a user to accept a recognized pattern by issuing a finger confirm 344 sign. The finger confirm 344 action can be an up and down finger movement signifying a "yes" at step 346. The method can then continue to step 302 to acquire a next finger sign. At step 348, the pattern is rejected if a discard action is detected. The step 334 can also continue to 302 for receiving another finger sign.

Referring to FIG. 18, a depiction for methods 330 and 340 is illustrated. The illustration follows from FIG. 17. It should be noted that the finger is at the second paused position (308) with regard to the illustration. After the second pause, the user can issue a finger confirm action (step 4), such as an up-down finger movement ("yes"), to accept the pattern. In one arrangement, upon acceptance, the pattern 146 can saved to the display 116. For example, each recognized finger sign can be placed at the top of the display 116 (Step 5). This allows the user to see previously recognized finger signs. It can also be visually helpful if the user is finger signing a telephone number, a name, an address or any other textual representation. If the user issues a left-right finger movement ("no"), the pattern is discarded. In this case, the recognized finger pattern is not saved to the top of the display. The saving and displaying of recognized characters provides the user visual feedback. Other finger confirmation movements are also contemplated. If the user leaves the finger at the same location (i.e. continues pause), then the pattern 146 is rejected. Notably, the control mechanism of method 330 and 340 for accepting or rejecting a recognized pattern 146 is different from method 320. That is, embodiments of the invention are directed to various methods of touchless control which are herein contemplated. Each of the methods discussed is a variation for accepting and rejecting recognized patterns.

Figure 22:
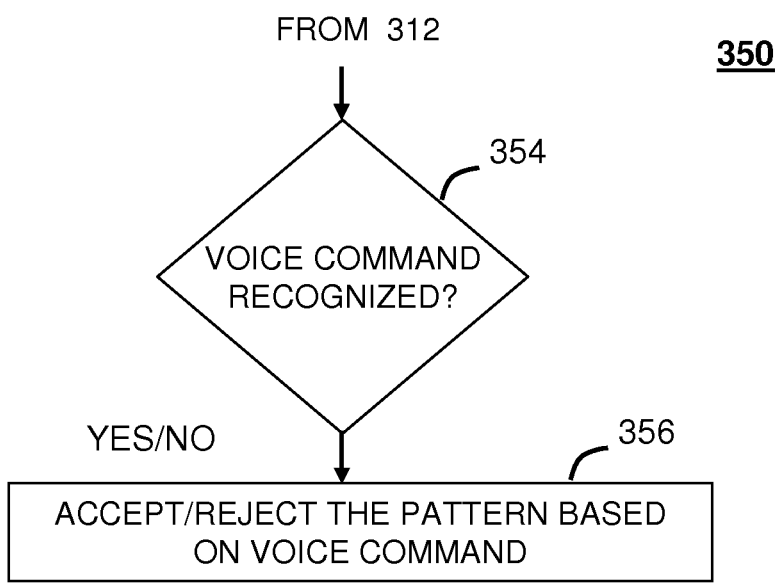
FIG. 22 is a method for touchless finger signing based on a first location and a finger pause at a second location in accordance with an embodiment of the inventive arrangements.

Referring to FIG. 22, yet another method of touchless control for accepting or rejecting a pattern is shown. Briefly, the method 350 allows a user to speak a voice command to control acceptance. At step 354, a voice command can be received. At step 36, the pattern can be accepted if a verbal confirmation is received, or the pattern can be rejected if a verbal decline is received. In one arrangement, the method 350 can be combined with methods 300-340 for allowing a user to perform a finger action or a voice command.

Figure 23:
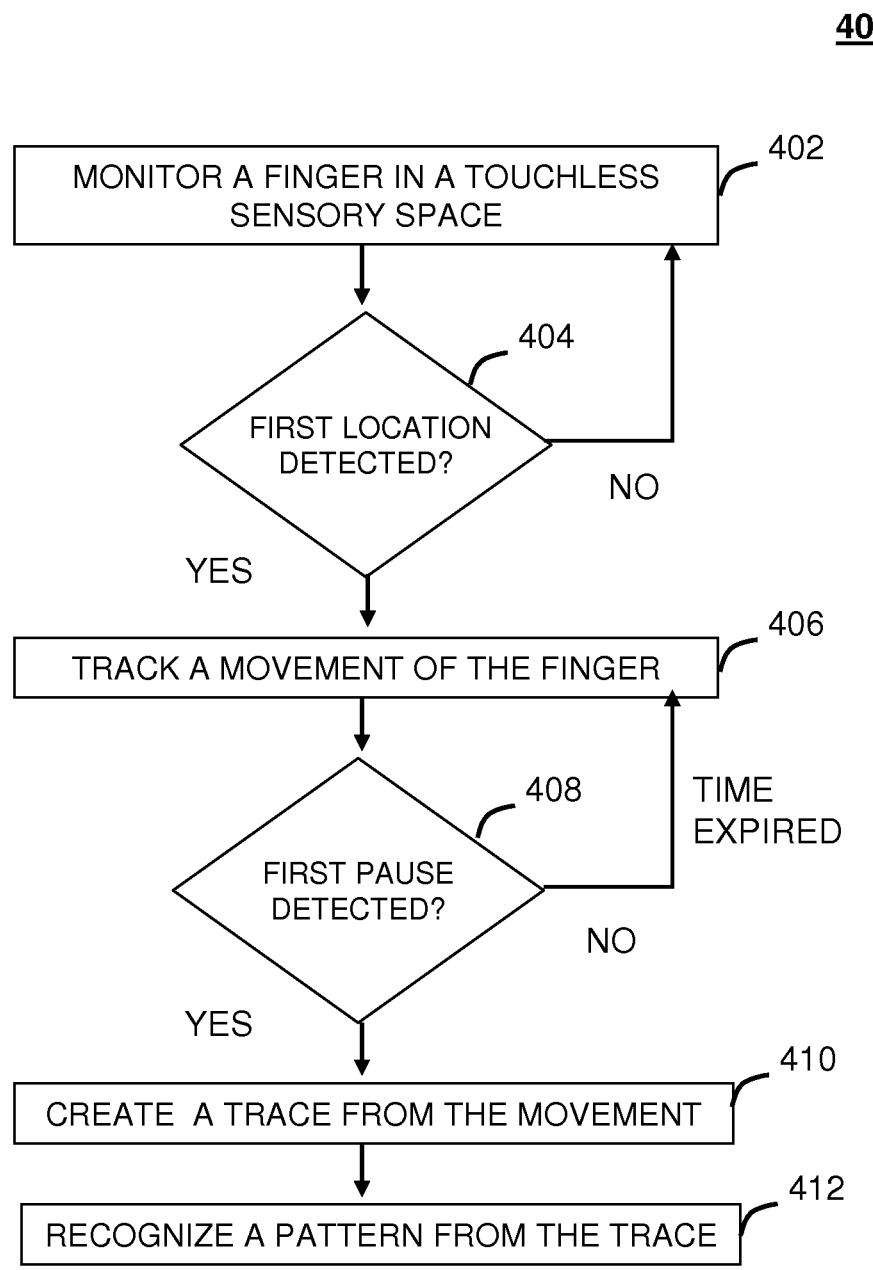
FIG. 23 is a depiction for recognizing positional traces based on a first location and a second location in accordance with an embodiment of the inventive arrangements.

Referring to FIG. 23, another method 400 for touchless finger signing is shown. Briefly, the method 400 is based on detection of a first location and detection of a pause at a second location. The trace is generated between the first location and the second location. The method 400 can be practiced with more or less than the number of steps shown. To describe the method 400, reference will be made to FIGS. 2, 17 and 14-30 although it is understood that the method 400 can be implemented in any other suitable device or system using other suitable components. Moreover, the method 400 is not limited to the order in which the steps are listed in the method 400. In addition, the method 400 can contain a greater or a fewer number of steps than those shown in FIG. 23.

At step 402, a finger movement in a touchless space can be monitored. For example, referring to FIG. 2, the user may extend a finger in the touchless sensing space 101 for performing finger signing. At step 404, a first location can be detected. For example, the user may position the finger at an origin point in the touchless sensing space 101. The origin can be associated with a start of a finger sign. The origin can also correspond to a center of a mobile device display. The controller 120 can determine an absolute position of the finger in the touchless sensing space 101. For example, the controller 120 can compare the coordinates received by the sensing unit 110, and evaluate a distance to an origin point. For example, the controller 120 can calculate a Euclidean distance between a current location of the finger and an origin that is known. The method step 404, can also take into account timing information. For example, a detection of the finger at the first location may also require that the finger be briefly still (e.g. paused). Upon detecting the finger at the first location, and also possibly a pause, at step 406, a movement of the finger can be tracked. The controller 120 can receive absolute or relative locations of the finger during generation of the finger sign 140. The controller 120 can store the coordinates for tracking the finger sign. At step 408, a pause at a second location can be detected. For example, the user, upon completing the finger sign, can leave the finger at the final location of the finger sign, which corresponds to the second location. The controller 120 can continue to track the finger movement if the pause is not detected. At step 410, a trace can be created in response to detecting the pause at the second location. The second location, serves as a reference point for ending a finger sign. During continuous finger signing, the movement of the finger to the second location informs the controller 120 that the finger sign is complete. At step 412, in response to creating the finger trace, a pattern can be recognized from the trace. For example, the controller 120 can submit the trace to the recognition engine 114 for recognizing the finger sign.

Figure 24:
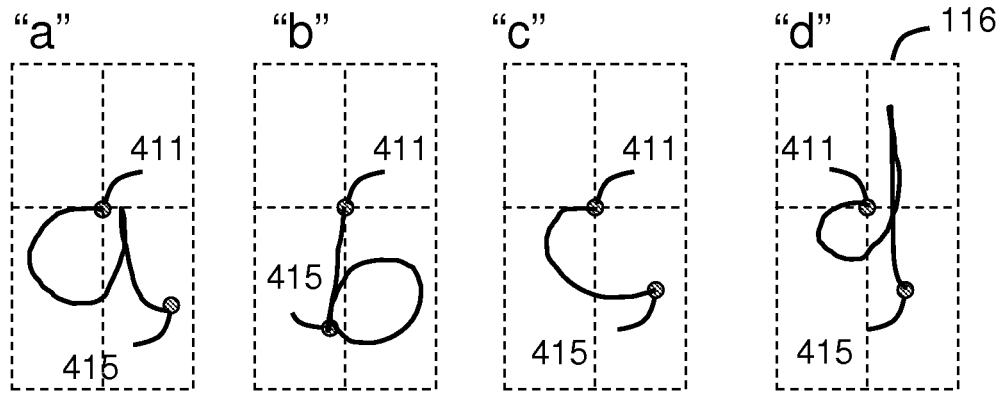
FIG. 24 is a more detailed diagram of the first and second finger location in accordance with an embodiment of the inventive arrangements.
Figure 25:
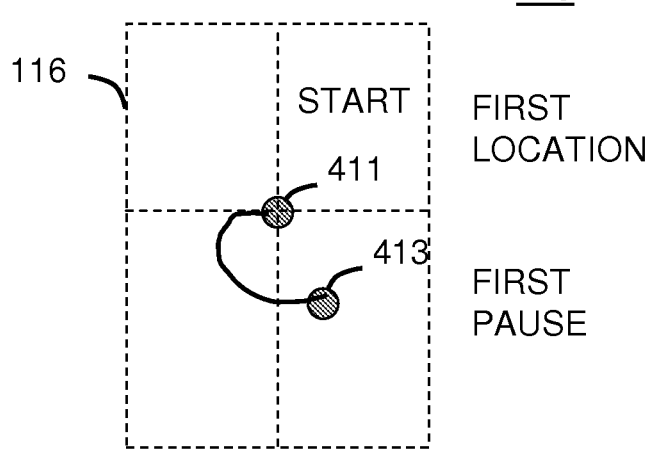
FIG. 25 is a method for presenting and accepting a pattern based on a return finger movement in accordance with an embodiment of the inventive arrangements.

Referring to FIG. 24, a depiction for the method 400 of touchless finger signing is shown. Briefly, exemplary positional traces 145 for the letters 'a', 'b', 'c', and 'd' are shown. Notably, each positional trace 145 starts at a center location 411 in the display 116. The center 411 in the display 117 can also correspond to an origin in the touchless sensing space 101, or a sweet-spot in the touchless sensing space 101. In practice, the user begins the finger signing an origin region in the touchless sensing space 101. The origin may correspond to the location of greatest sensitivity of the sensing unit 110. The user draws out the finger sign, starting at the first location 411, and completes the finger sign at the second location 415. The user pauses the finger at the second location 415 to denote completion of the finger sign. Referring to FIG. 25, a detailed view of a positional trace for the letter 'c' is shown. In the arrangement shown, the start location of the positional trace is at the center of the display 116. The user similarly pauses the finger at the second location 413 (see also 415 FIG. 24) to denote completion of the finger sign.

Figure 26:
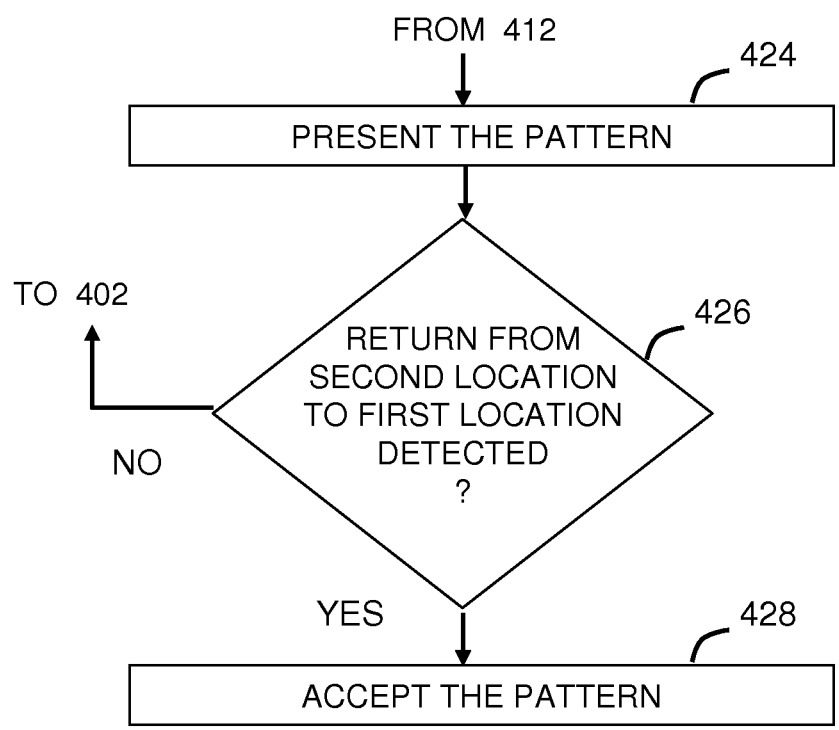
FIG. 26 is a depiction of a return movement for positional traces in accordance with an embodiment of the inventive arrangements.

Referring to FIG. 26, at step 424, if the pause is detected, the pattern can be presented 426 on the display. For example, referring back to FIG. 17, the pattern 146 is displayed in view of the positional trace 145. This allows the user to see the pattern recognized. In this example, the pattern 'e' 146 can be presented on the display 116 upon the neural network processing the positional trace 145 (also see FIG. 25). After the pause is detected, the user can accept or reject the pattern recognized. In practice, the user will move the finger back to the center 411 if the pattern is a correct match of the finger sign. The moving of the finger from the second location 415 back to the first location 411 is a return movement 417. If the return movement 417 is detected, the pattern can be accepted at step 428. If the return movement 417 is not detected, the controller 120 can clear the finger sign memory, and restart monitoring the finger in the touchless sensing space 101. If the pattern is an incorrect match, the user can reject the pattern by not returning to the first location. For example, the user may continue the pause or shake the finger to reject the pattern.

Figure 27:
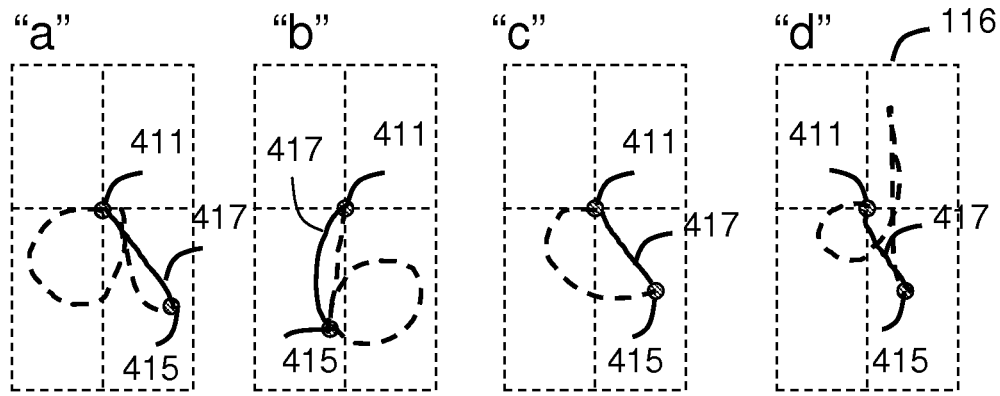
FIG. 27 is a depiction of return movements for positional traces in accordance with an embodiment of the inventive arrangements.

Referring to FIG. 27, exemplary return movements 417 for each of the positional traces 'a', 'b', 'c', and 'd' are shown. Notably, each return movement 417 begins at the second location 415 and ends at the first location 411. In such regard, the user, upon seeing the recognized pattern 146 on the display, can accept the pattern, by returning the finger from the second position 415 to the first location 411 (e.g. center). In rapid finger signing applications, this is a quick way to process and accept sequential recognized patterns from sequential finger signs. It should also be noted that the sensing device can perform continuous pattern recognition of finger movements based on a return of the finger at a center location in the touchless sensory space. The user can trace a letter without pausing at the second location so long as the user returns approximately to the center location. In such regard, the user can perform touchless texting with continuous finger movements without pausing the finger. Moreover, the sensing device can predict word completions and suggest word completions in view of recognized alphanumeric characters.

Figure 28:
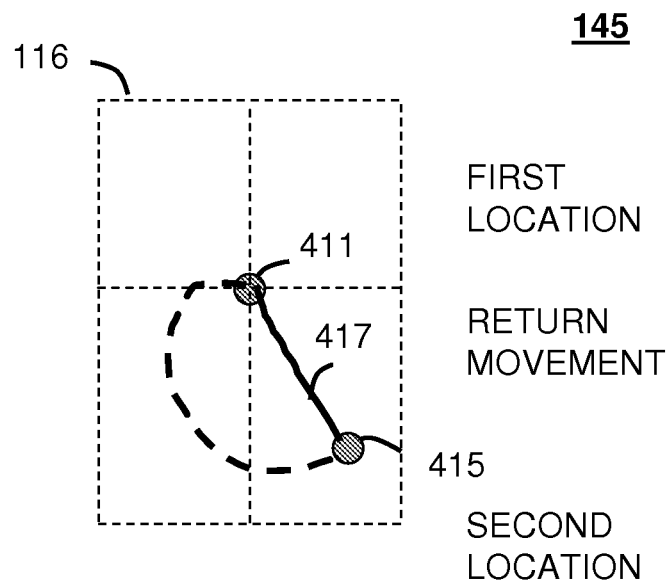
FIG. 28 is a depiction of a return movement for positional traces in accordance with an embodiment of the inventive arrangements.

Referring to FIG. 28, a more detailed view of the return movement 417 is shown. Notably, the return movement is from a boundary region 415 to the origin 411. In practice, once the user has left the boundary region, the return movement can occur from anywhere outside the display 116 back to the origin 411.

Briefly, the return movement also constitutes temporal information which can be considered a distinguishing feature by the neural network 200. The return movement 417 can help the controller 130 or the neural net 200 segment the trace 145. Moreover, since every finger sign will have a return movement, the neural network 200 can disassociate the return movement during pattern recognition. That is, the neural net 200 can use the return movement 417 for segmentation purposes, and then disregard the return movement 417 in pattern recognition since it is a common features across all finger signs 140. Moreover, the neural network 200 can be trained with the return movement 417.

Figure 29:
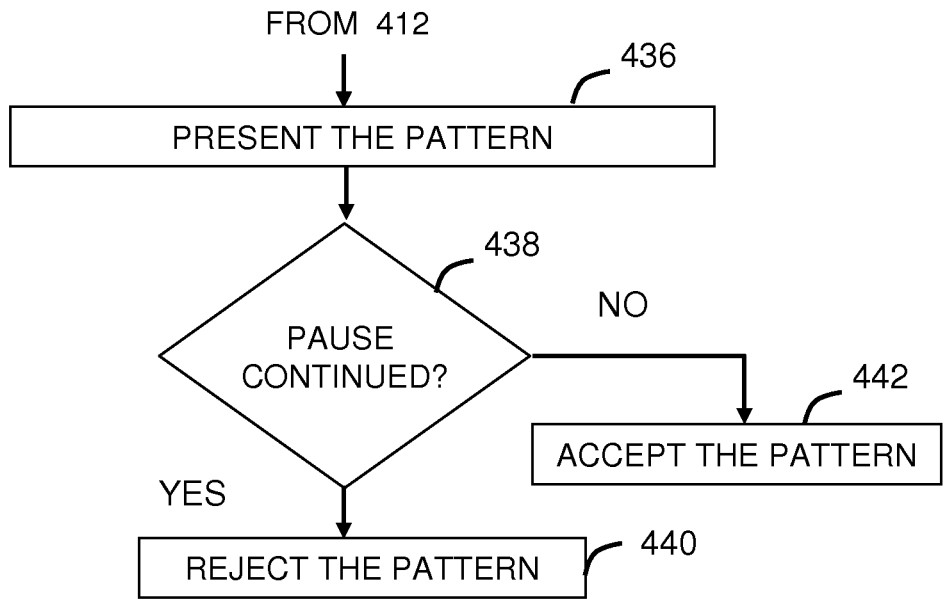
FIG. 29 is a method for presenting and accepting a pattern based on a continued finger pause in accordance with an embodiment of the inventive arrangements.

Referring to FIG. 29, an auxiliary method for accepting or rejecting the pattern is shown. The method can continue from method step 412 after a pattern has been recognized (FIG. 23). At step 436, the pattern can be presented on the display. This allows the user to see the recognized pattern and determine whether to accept or reject the pattern. The pattern is accepted or rejected depending on the length of time the user keeps the finger still at the second location 415 after the pattern is presented on the display 116. Recall, in method 420, the user accepts the pattern by issuing a return movement 417. In contrast, at step 438, a decision can be made as to whether the pause at the second location is continued. If the pause is continued, the pattern is rejected at step 440. This means that the user has not returned the finger to the first location; the user may be dissatisfied with the recognized pattern. If the pause is not continued, then the pattern is accepted at step 442. In such regard, the user does not need to return to the first location as in method step 426 to accept the pattern. The user simply, needs to move the finger away from the second location 415 to accept the recognized pattern. The user can then return to the first location 411 to submit another finger sign. This is a quick way to reject recognized patterns during sequential finger signing as shown at step 440.

Figure 30:
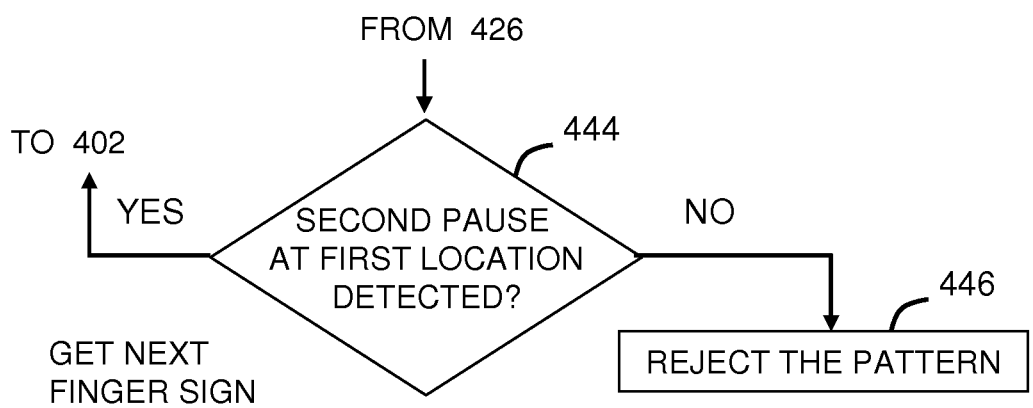
FIG. 30 is a method for repeating touchless finger signing recognition in accordance with an embodiment of the inventive arrangements.

Referring to FIG. 30, a continuation of the method 400 for finger signing is shown. Briefly, the method check for a pause at the first location to restart finger sign recognition. The method can continue from step 426 of FIG. 27. That is, upon detecting a return finger movement, at step 444, a detection of a pause at the first location can be considered. In general, a user will pause the finger before starting a new finger sign. The method step 444 checks for the final pause preceding a finger sign. For example, referring to FIG. 28, a second pause can be detected after the return movement 417 when the finger returns from the second location 415 to the first location 411. The second pause at the first location can signify a completion of a performed finger sign, and also a start of a new finger sign. Returning back to FIG. 31, upon detecting the second pause at the first location, the method for recognizing a finger sign can restart. If the second finger pause is not detected, the method can reject the pattern. This is also a secondary means for rejecting a pattern, that may have been previously accepted in error as shown at step 446.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

For example, FIG. 23 depicts an exemplary diagrammatic representation of a machine in the form of a computer system 600 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 600 may include a processor 602 (e.g., a central processing unit (CPU), a graphics processing unit (GPU, or both), a main memory 604 and a static memory 606, which communicate with each other via a bus 608. The computer system 600 may further include a video display unit 610 (e.g., a liquid crystal display (LCD), a flat panel, a solid state display, or a cathode ray tube (CRT)). The computer system 600 may include an input device 612 (e.g., a keyboard), a cursor control device 614 (e.g., a mouse), a disk drive unit 616, a signal generation device 618 (e.g., a speaker or remote control) and a network interface device 620.

The disk drive unit 616 may include a machine-readable medium 622 on which is stored one or more sets of instructions (e.g., software 624) embodying any one or more of the methodologies or functions described herein, including those methods illustrated above. The instructions 624 may also reside, completely or at least partially, within the main memory 604, the static memory 606, and/or within the processor 602 during execution thereof by the computer system 600. The main memory 604 and the processor 602 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 624, or that which receives and executes instructions 624 from a propagated signal so that a device connected to a network environment 626 can send or receive voice, video or data, and to communicate over the network 626 using the instructions 624. The instructions 624 may further be transmitted or received over a network 626 via the network interface device 620.

While the machine-readable medium 622 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and carrier wave signals such as a signal embodying computer instructions in a transmission medium; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

While the preferred embodiments of the invention have been illustrated and described, it will be clear that the embodiments of the invention is not so limited. Numerous modifications, changes, variations, substitutions and equivalents will occur to those skilled in the art without departing from the spirit and scope of the present embodiments of the invention as defined by the appended claims.

What is claimed is:

1. A method for touchless character recognition, comprising:
    detecting a first pause of a finger in a touchless sensory space at a first location;
    after the first pause, tracking a movement of the finger in the touchless sensory space;
    detecting a second pause of the finger in the touchless sensory space at a second location;
    after the second pause, creating a trace of the finger movement between the first pause and the second pause from the tracking;
    recognizing a pattern from the trace, wherein the pattern is an alphanumeric character or a finger gesture;
    presenting the pattern in response to the second pause at the second location; and
    consequently thereafter providing a finger gesture detection state to accept or reject the pattern, consisting of:
        detecting a returning movement of the finger from the second location upon release of the second pause to the first location of the trace coinciding with the first pause for accepting the pattern corresponding to the trace,
        detecting a finger discard action comprising a finger movement away from the first location for rejecting the pattern: and
    either accepting the pattern corresponding to the trace when the returning movement is detected towards and returns to the first location, or rejecting the pattern when the finger action is directed away from the first location.

2. The method of claim 1, wherein the step of creating the trace comprises generating a differential trajectory for an x, y, and a z component along three dimensions of an ultrasonic sensing field producing the touchless senory space and providing touchless control.

3. The method of claim 1, further comprising:
    wherein the finger discard action is at least one of an up and down finger movement in the touchless sensory space, a finger swipe movement in the touchless sensory space, a jitter finger movement in the touchless sensory space, or a finger sweep movement in the touchless sensory space.

4. The method of claim 1, further comprising:
    presenting the pattern in response to the second pause;
    detecting a finger confirm action; and
    accepting the pattern,
wherein the finger confirm action is at least one of an up and down finger movement in the touchless sensory space, a finger swipe movement in the touchless sensory space, a jitter finger movement in the touchless sensory space, or a finger sweep movement in the touchless sensory space.

5. The method of claim 1, further comprising:
    performing a software action in response to recognizing the finger gesture.

6. A method for touchless finger gesturing, comprising:
    at a first time, upon detecting a first pause proceeded by detecting a finger at a first location in a touchless sensory space;
    tracking a movement of the finger in the touchless sensory space;
    at a second time, detecting the finger at a second location in the touchless sensory space proceeded by a second pause;
    creating a trace of the finger movement between the first location and the second location from the tracking;
    during the second pause, recognizing a pattern from the trace and presenting the pattern in response to detecting the finger the second time at the second location; and
    consequently thereafter providing a finger gesture detection state to accept or reject the pattern, consisting of:
        detecting a return movement of the finger from the second location upon release of the second pause to the first location of the trace for accepting the pattern corresponding to the trace, detecting a finger discard action comprising a finger movement away from the first location for rejecting the pattern; and, either accepting the pattern corresponding to the trace when the returning movement is detected towards and returns to the first location, or rejecting the pattern when the finger action is directed away from the first location.

7. The method of claim 6, further comprising:
detecting a continued pause of the finger at the second location; and
rejecting the pattern.

8. The method of claim 6, further comprising:
performing continuous pattern recognition of finger movements based on a returning of the finger to a center location in the touchless sensory space.

9. The method of claim 6, wherein the first location in the touchless sensory space corresponds to a center region in a display presenting the trace.

10. The method of claim 6, further comprising:
detecting a second pause at the first location; and
repeating the method for touchless finger gesturing.

11. A mobile device suitable for touchless finger signing having a
a sensor device for tracking a movement of a finger in a touchless sensing space; and
a recognition engine for
detecting a first pause of a finger in a touchless sensory space at a first location;
after the first pause, tracking a movement of the finger in the touchless sensory space;
detecting a second pause of the finger in the touchless sensory space at a second location;
after the second pause, creating a trace of the finger movement between the first pause and the second pause from the tracking; and
during the second pause identifying at least one pattern in the trace, wherein the pattern is an alphanumeric character, letter, finger gesture or symbol also during the second a se presenting the pattern in response to the second pause at the second location; and consequently thereafter providing a finger gesture detection state to accept or reject the pattern, consisting of:

detecting a return movement of the finger from the second location to the first location of the trace upon release of the second pause for accepting and processing the pattern to provide touchless user interface, detecting a finger discard action comprising a finger movement away from the first location for rejecting the pattern and either accepting the pattern corresponding to the trace when the returning movement is detected towards and returns to the first location or rejecting the pattern when the finger action is directed away from the first location.

12. The mobile device of claim 11, further comprising a controller for creating the trace from the movement, wherein the trace is a differential trajectory that incorporates spatial and temporal information.

13. The mobile device of claim 12, wherein the recognition engine includes a neural network that processes the trace and classifies the at least one pattern as an alphanumeric character or a finger gesture.

14. The mobile device of claim 11, further comprising a display for presenting the pattern.

15. The mobile device of claim 14, wherein the mobile device is a cell phone, a portable music player, a laptop, a headset, or an earpiece.

16. The mobile device of claim 11, further comprising an audio module for audibly presenting the at least one pattern.

17. The mobile device of claim 16, wherein the audio module includes a voice recognition engine for recognizing a voice command and accepting or rejecting the pattern in response to the voice command.

* * * * *